(12) United States Patent
Wilson et al.

(10) Patent No.: US 10,655,226 B2
(45) Date of Patent: May 19, 2020

(54) APPARATUS AND METHODS TO IMPROVE ALD UNIFORMITY

(71) Applicant: Applied Materials, Inc., Santa Clara, CA (US)

(72) Inventors: Gregory J. Wilson, Kalispell, MT (US); Paul McHugh, Kalispell, MT (US); Karthik Ramanathan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/986,197

(22) Filed: May 22, 2018

(65) Prior Publication Data

US 2018/0340259 A1    Nov. 29, 2018

Related U.S. Application Data

(60) Provisional application No. 62/511,923, filed on May 26, 2017.

(51) Int. Cl.
| | | |
|---|---|---|
| *H01L 21/00* | (2006.01) | |
| *C23C 16/52* | (2006.01) | |
| *C23C 16/455* | (2006.01) | |
| *H01L 21/02* | (2006.01) | |
| *H01L 21/66* | (2006.01) | |
| *C23C 16/46* | (2006.01) | |
| *H01L 21/687* | (2006.01) | |
| *H01L 21/67* | (2006.01) | |

(52) U.S. Cl.
CPC ........ *C23C 16/52* (2013.01); *C23C 16/45544* (2013.01); *C23C 16/46* (2013.01); *H01L 21/0228* (2013.01); *H01L 21/67109* (2013.01); *H01L 21/67248* (2013.01); *H01L 21/68771* (2013.01); *H01L 22/20* (2013.01); *H01L 22/26* (2013.01); *H01L 22/12* (2013.01)

(58) Field of Classification Search
CPC .......... H01L 21/0228; H01L 21/67109; H01L 21/67248; H01L 21/68771; H01L 22/20; H01L 22/26; C23C 16/52; C23C 16/45544; C23C 16/46
See application file for complete search history.

(56) References Cited

U.S. PATENT DOCUMENTS

| | | | |
|---|---|---|---|
| 7,020,537 B2 | 3/2006 | Wilson et al. | |
| 7,160,421 B2 | 1/2007 | Wilson et al. | |
| 7,189,318 B2 | 3/2007 | Wilson et al. | |
| 7,751,908 B2 | 7/2010 | Chang et al. | |
| 9,023,664 B2 | 5/2015 | Chang et al. | |
| 2007/0077355 A1* | 4/2007 | Chacin ................. | C23C 16/481 427/248.1 |

(Continued)

*Primary Examiner* — Victor A Mandala
*Assistant Examiner* — Colleen E Snow
(74) *Attorney, Agent, or Firm* — Servilla Whitney LLC (57) ABSTRACT

Apparatus and methods to deposit a film using a batch processing chamber with a plurality of heating zones are described. The film is deposited on one or more substrates and the uniformity of the deposition thickness is determined at a plurality of points. The heating zones set points are applied to a sensitivity matrix and new temperature or power set points for the heating zones are determined and set. One or more substrates are processed using the new set points and the thickness uniformity is determined and may be adjusted again to increase the uniformity.

19 Claims, 6 Drawing Sheets

(56) References Cited

U.S. PATENT DOCUMENTS

2008/0173735 A1\* 7/2008 Mitrovic ........... C23C 16/45565
                                                                                          239/548
2018/0128647 A1\* 5/2018 Kim .................. C23C 16/45544

\* cited by examiner

APPARATUS AND METHODS TO IMPROVE ALD UNIFORMITY

CROSS-REFERENCE TO RELATED APPLICATIONS

This application claims priority to U.S. Provisional Application No. 62/511,923, filed May 26, 2017, the entire disclosure of which is hereby incorporated by reference herein.

TECHNICAL FIELD

The present disclosure is directed to the field of automatic process control, and, more particularly, to the field of controlling a material deposition process.

BACKGROUND

The fabrication of microelectronic components from a microelectronic workpiece, such as a semiconductor wafer substrate, polymer substrate, etc., involves a substantial number of processes. For purposes of the present application, a microelectronic workpiece is defined to include a workpiece formed from a substrate upon which microelectronic circuits or components, data storage elements or layers, and/or micro-mechanical elements are formed. There are a number of different processing operations performed on the microelectronic workpiece to fabricate the microelectronic component(s). Such operations include, for example, material deposition, patterning, doping, chemical mechanical polishing, electropolishing, and heat treatment.

Material deposition processing involves depositing or otherwise forming thin layers of material on the surface of the microelectronic workpiece. Patterning provides selective deposition of a thin layer and/or removal of selected portions of these added layers. Doping of the semiconductor wafer, or similar microelectronic workpiece, is the process of adding impurities known as "dopants" to selected portions of the wafer to alter the electrical characteristics of the substrate material. Heat treatment of the microelectronic workpiece involves heating and/or cooling the workpiece to achieve specific process results. Chemical mechanical polishing involves the removal of material through a combined chemical/mechanical process while electropolishing involves the removal of material from a workpiece surface using electrochemical reactions.

Numerous processing devices, known as processing "tools," have been developed to implement one or more of the foregoing processing operations. These tools take on different configurations depending on the type of workpiece used in the fabrication process and the process or processes executed by the tool. One type of tool used in the manufacturing of semiconductor devices is a batch processing tool capable of depositing a film on multiple substrates. A plurality of substrates are supported on a heated susceptor assembly and rotated about a central axis. During rotation, the substrates are exposed to deposition gases in various processing regions of the processing chamber. The temperature uniformity of the substrates has a direct effect on the deposition uniformity of the process. Therefore, there is a need in the art for apparatus and methods to improve temperature uniformity in a batch processing chamber.

SUMMARY

One or more embodiments of the disclosure are directed to processing chamber comprising a gas distribution assembly, a susceptor assembly, a heater assembly and a controller. The susceptor assembly has a central support post and a top surface adjacent to and spaced from the gas distribution assembly. The heater assembly comprises a plurality of heating elements arranged in zones. Each zone is spaced a distance from the central support post so that each zone is a different distance from the support post. The controller is operatively connected to the plurality of heating elements and is configured to adjust power or temperature of one or more of the heating elements based on a plurality of film thickness measurement and a sensitivity matrix characterizing effects of changes in temperature or power set points for the individual heating zones.

Additional embodiments of the disclosure are directed to processing chambers comprising a gas distribution assembly, a susceptor assembly, a heater assembly and a controller. The susceptor assembly has a central support post and a top surface adjacent to and spaced from the gas distribution assembly. The heater assembly comprises four heating elements spaced at increasing distances from the central support post. The four heating elements form a first heating zone, a second heating zone, a third heating zone and a fourth heating zone. The heater assembly includes a heat shield positioned between one or more of the first heating zone and the second heating zone or the third heating zone and the fourth heating zone. The heat shield comprises one or more of quartz or stainless steel. The controller is operatively connected to the plurality of heating elements and is configured to adjust power or temperature of one or more of the heating elements based on a plurality of film thickness measurement and a sensitivity matrix characterizing effects of changes in temperature or power set points for the individual heating zones.

Further embodiments of the disclosure are directed to methods of forming a film comprising depositing a film on a substrate using a predetermined processing method. The processing method includes temperature or power set points for a plurality of heating zones. The thickness of the film is measured at a plurality of locations on the substrate and converting the plurality of thickness measurements to temperature. The temperature or power set points of at least one of the heating zones are adjusted based on the plurality of thickness measurements. Where adjusting the temperature or power set points comprises applying a sensitivity matrix to adjust at least one of the heating zones. The sensitivity matrix characterizes effects of changes in temperature or power set points for individual heating zones on deposited material thickness at the plurality of locations on the substrate. A second film is deposited on a second substrate using the predetermined method with the adjusted temperature or power set points and the thickness of the second film is measured at the plurality of locations. Adjusting the temperature or power set points followed by depositing of a film and measuring the thickness at a plurality of locations on the substrate can be repeated to lower a thickness non-uniformity of the deposited film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
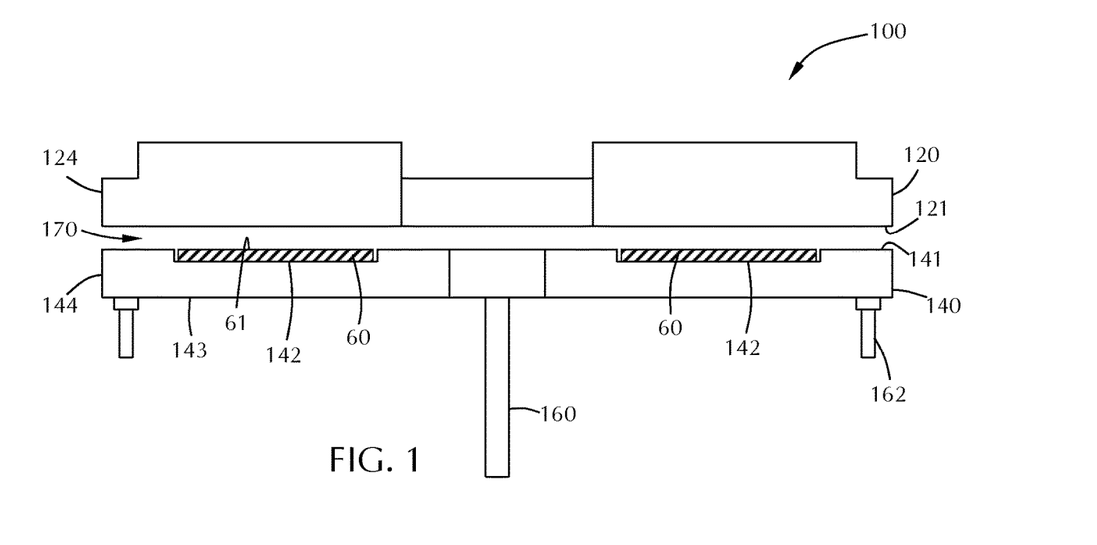
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
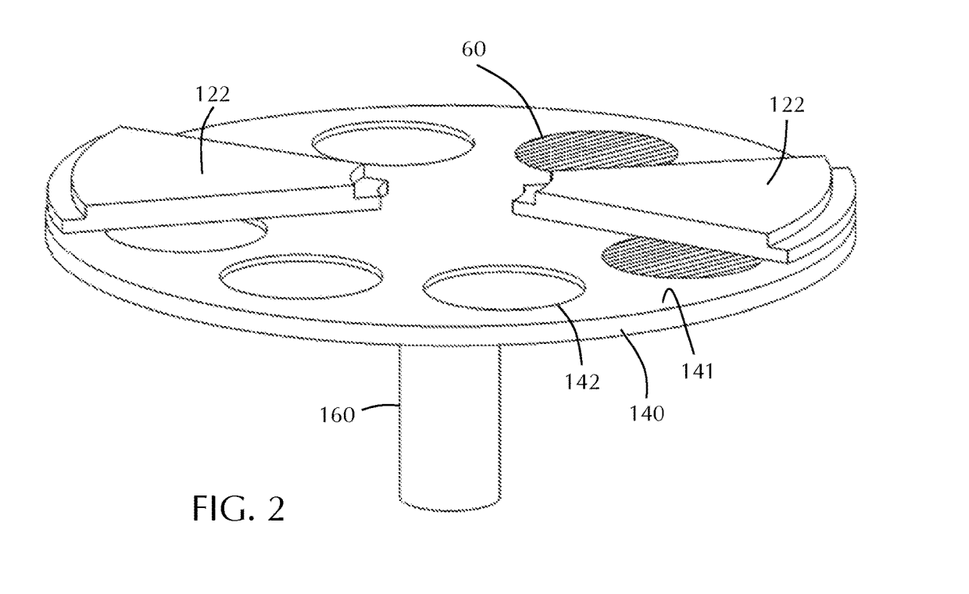
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
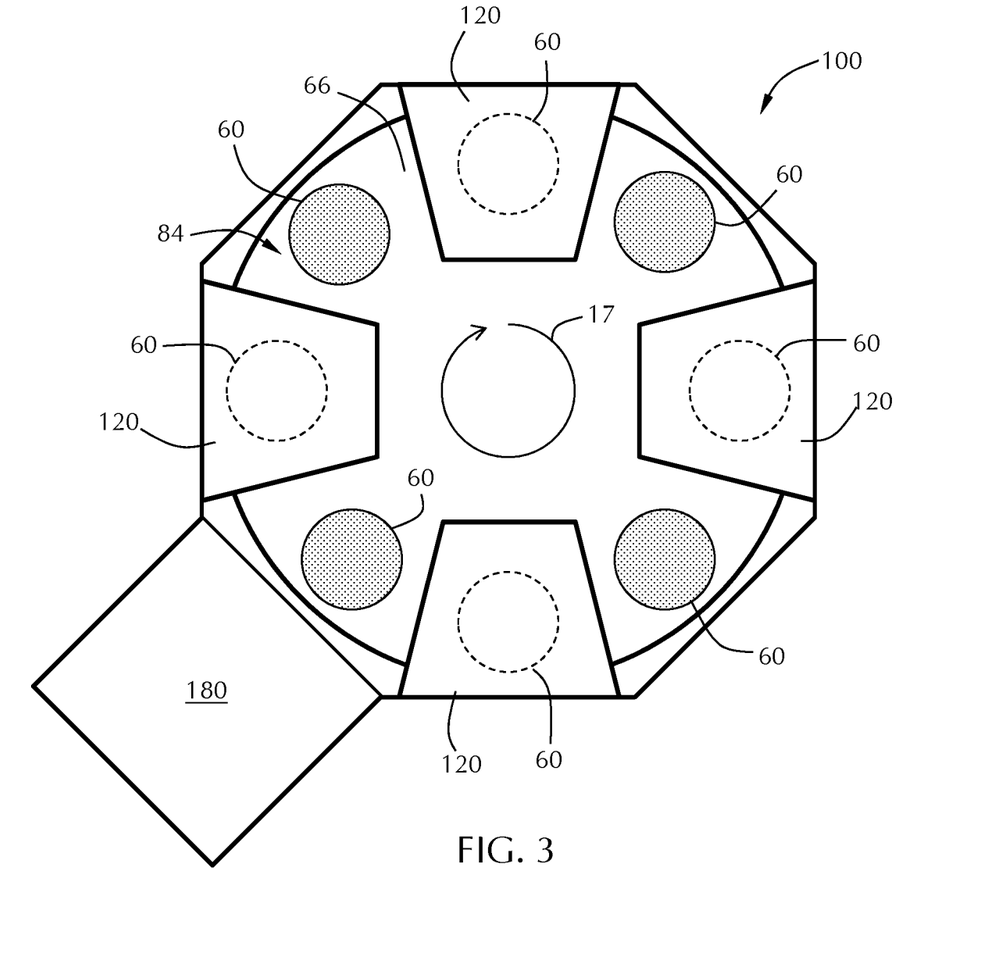
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to a gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
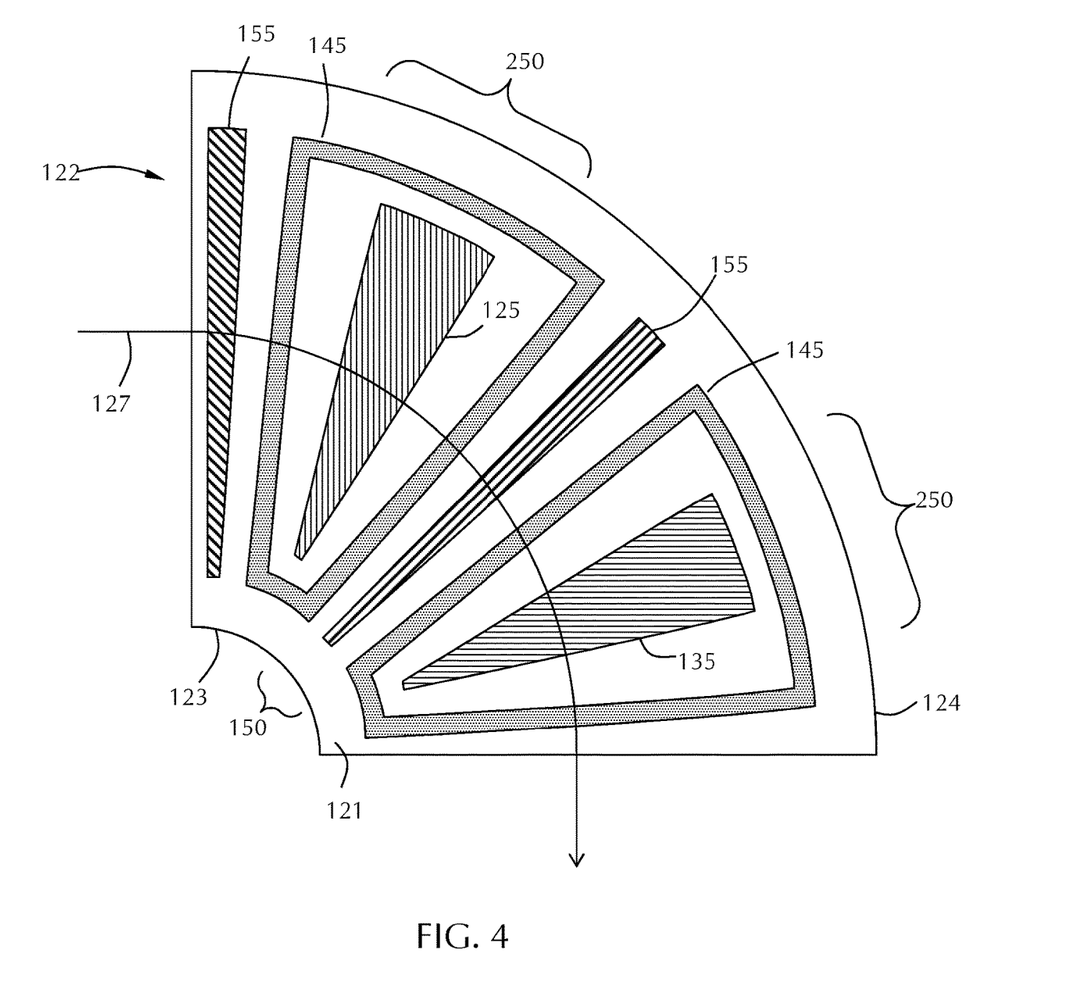
FIG. 4 shows a schematic view of a portion of a wedge shaped gas distribution assembly for use in a batch processing chamber in accordance with one or more embodiment of the disclosure.
Figure 5:
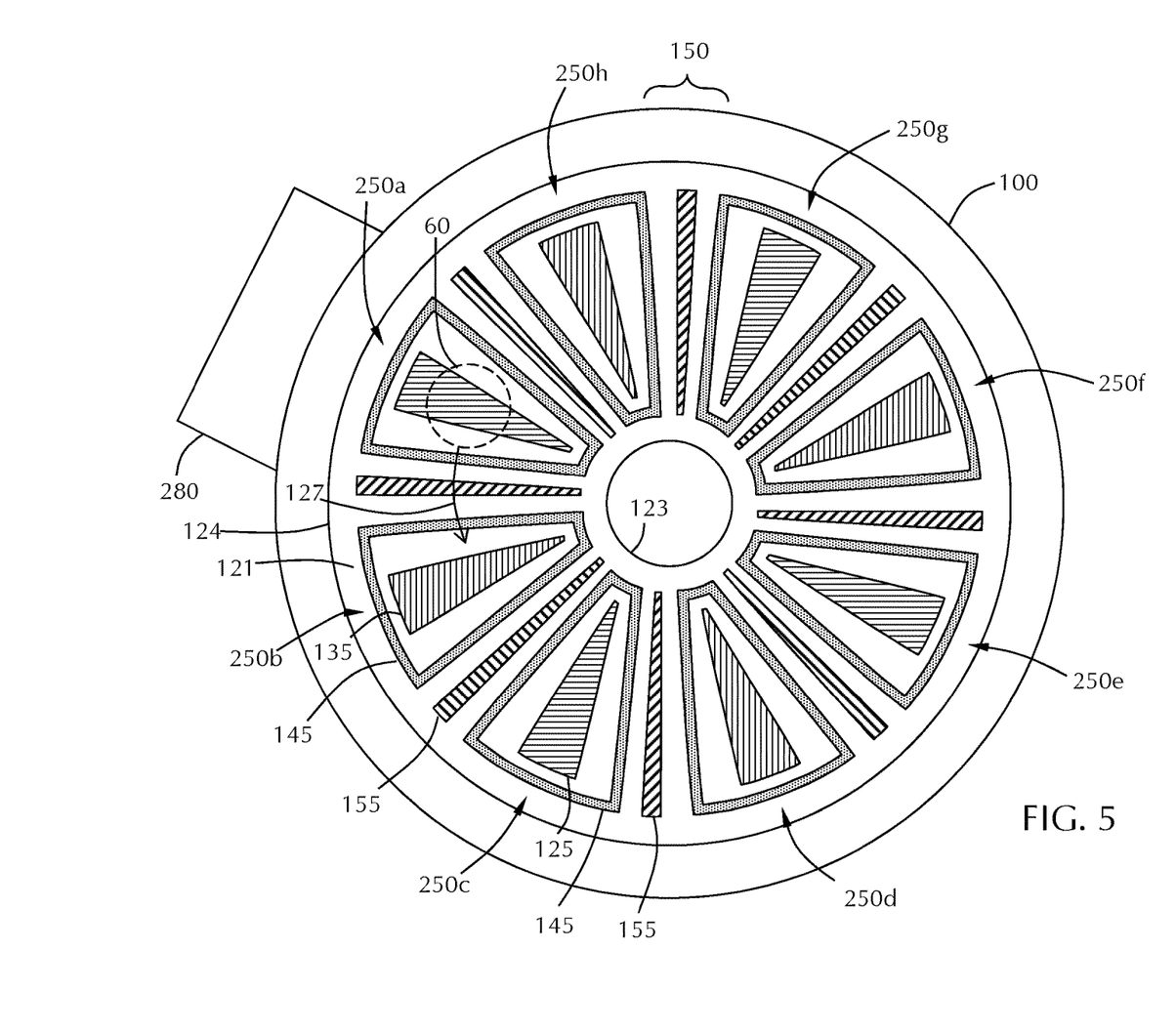
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and vacuum ports 145 in a front surface 121 of the gas distribution assembly 220. The plurality of elongate gas ports 125, 135, 155 and vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas and the second reactive gas to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process regions. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150*a*, 150*b*. Rotating the substrate 60 along path 127 will move the substrate counter-clockwise around the processing chamber 100. Thus, the substrate 60 will be exposed to the first process region 250*a* through the eighth process region 250*h*, including all process regions between.

Embodiments of the disclosure are directed to processing methods comprising a processing chamber 100 with a plurality of process regions 250*a*-250*h* with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250*a*-250*h*. The number of gas curtains is generally equal to or greater than the number of process regions.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

A first reactive gas A is flowed into one or more of the process regions 250 while an inert gas is flowed into any process region 250 which does not have a first reactive gas A flowing into it. For example if the first reactive gas is flowing into process regions 250*b* through process region 250*h*, an inert gas would be flowing into process region 250*a*. The inert gas can be flowed through the first reactive gas port 125 or the second gas port 135.

The inert gas flow within the process regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the process regions easier by decreasing the differences in pressure between adjacent regions.

The susceptor assembly body can include a plurality of heaters or high temperature heating elements. The high temperature heating elements can be separated to form multiple zones for heating purposes. In some embodiments, one or more of the zones are separated from an adjacent zone by a physical barrier (e.g., a stainless steel plate). Increasing uniformity can be challenging for processes that are controlled, at least partially, by thermal uniformity. This is because the temperature profile across the wafer cannot be measured accurately. The wafer temperature profile can be controlled by adjusting the set points of the multi-zone heater, but the challenge is to know what the set points should be. Set point adjustments have been performed by a trial-and-error approach. Each process engineer might have a unique approach with various degrees of success. The process is time consuming and the optimal uniformity is not always obtained.

Embodiments of the disclosure provide apparatus and methods to provide a standard methodology to optimize heater set points based on prior wafer processes. Some embodiments advantageously provide methods to optimize the heater setting within one or two iterations. Some embodiments advantageously provide apparatus and methods to control the set points of a multi-zone heater based on temperature or power. One or more embodiments advantageously provide methods and apparatus to deposit films with improved deposition uniformity.

In some embodiments, an ALD batch processing chamber is provided that includes a system to adjust the set points of a multi-zone heater to control the film deposition profile. The film profile of a previous wafer, along with the set points can be used to predict a new set of set points to improve the uniformity. The predictions can be based on the film response to perturbations from each set point. These responses can be obtained using numerical models of the ALD chamber for a variety of conditions. The changes in zone responses for various conditions can be taken into account. For example, the film response for high temperature processes (i.e., 600° C.) may be different than the response for a lower temperature process (i.e., 300° C.). The higher temperature process is more dominated by radiation heat transfer vs conduction heat transfer.

Figure 6:
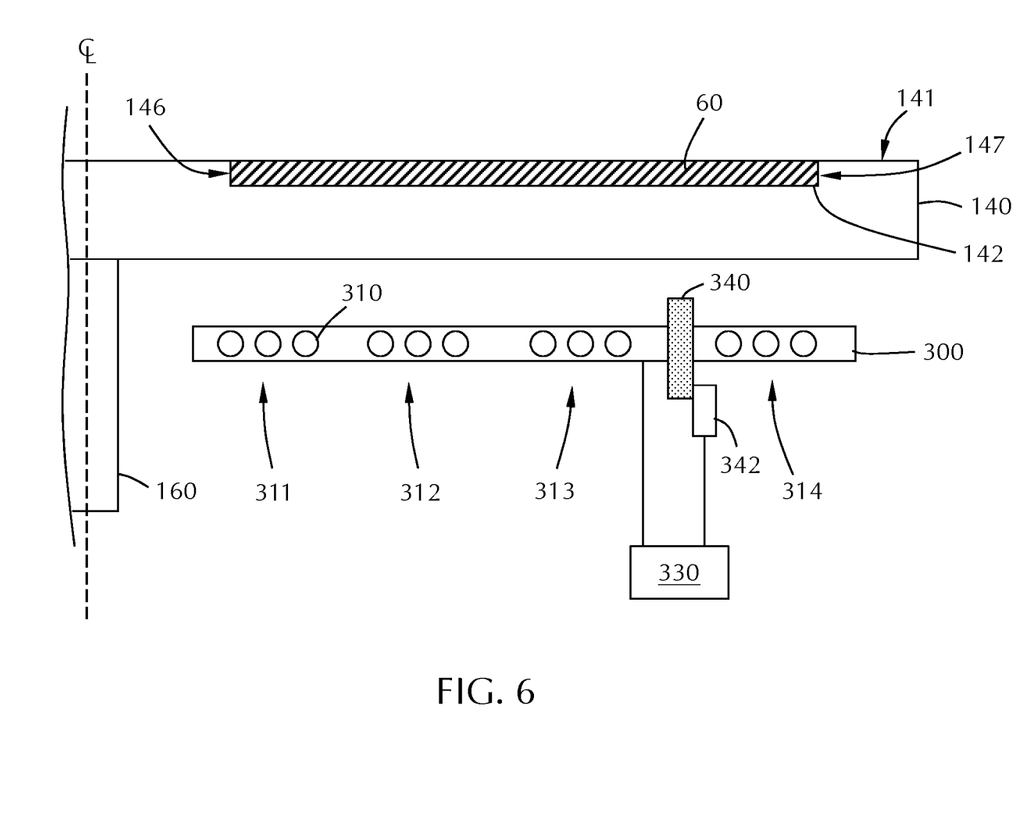
FIG. 6 shows a partial cross-sectional schematic view of a processing chamber in accordance with one or more embodiment of the disclosure.

FIG. 6 shows a partial cross-sectional view of a susceptor assembly 140 with a heater assembly 300 below. The heater assembly 300 can include a housing that supports a plurality of heating elements 310, or can be a plurality of heating elements 310 without an enclosure. The heating elements 310 can be circular or spiral shaped components that wrap around the support post 160 at a distance from the support post 160 or can be a plurality of straight segments that are arranged a distance around the support post 160. The embodiment illustrated in FIG. 6 the heating elements for each zone are illustrated as a spiral element that encircles the support post 160 three times. In some embodiments, there are more or less than three rotations of the heating elements. The number of rotations for each zone is independent of the other heating zones.

The plurality of heating elements 310 are arranged in zones 311, 312, 313, 314 from the inner-most to outer-most portions of the susceptor. The zones may be spaced apart from each other with the zone closest to the support post 160 designated as the first zone 311. The embodiment illustrated in FIG. 6 has four zones; a first zone 311, second zone 312, third zone 313 and fourth zone 314 as the outer-most zone. Those skilled in the art will recognize that there can be more or less zones than that shown in FIG. 6.

The zones can be aligned so that the center of the zone (measured from the support post) is aligned with the different parts of the substrate 60. In the embodiment shown, the first zone 311 is adjacent the inner peripheral edge 146 of the recess 142. The second zone 312 and third zone 313 are adjacent the middle portion of the recess 142. The fourth zone 314 is adjacent the outer peripheral edge 147 of the recess 142. The distance of the center of a zone can be measured based on the point of the recess closest to the support post. A negative distance means that the center of the zone is between the support post and the inner peripheral edge of the recess 142. In an exemplary embodiment, the recess 142 is 300 mm in diameter and the center of the first zone 311 is in the range of −5 mm to about 13 mm, or in the range of about 0 mm to about 6 mm, or about 3 mm from the inner peripheral edge 146 of the recess 142. The center of the second zone 312 of some embodiments is in the range of about 80 mm to about 120 mm, or in the range of about 90 mm to about 110 mm, or in the range of about 95 mm to about 105 mm, or about 101 mm from the inner peripheral edge 146 of the recess 142. The center of the third zone 313 of some embodiments is in the range of about 180 mm to about 220 mm, or in the range of about 190 mm to about 210 mm, or in the range of about 195 mm to about 205 mm, or about 199 mm from the inner peripheral edge 146 of the recess 142. The center of the fourth zone 314 of some embodiments is in the range of about 280 mm to about 320 mm (outside the outer peripheral edge 147 of the recess 142), or in the range of about 290 mm to about 310 mm, or in the range of about 295 mm to about 305 mm, or about 297 mm from the inner peripheral edge 146 of the recess 142.

A controller (not shown) can be connected to the components of the processing chamber to control the various aspects of a process recipe. The controller may be connected to the susceptor assembly to control the lift and rotation of the susceptor. The controller can be connected to the gas distribution assembly and any gas boxes or gas sources connected to the gas distribution assembly to control flow rates and pressures. The controller can be connected to the heater assembly to control the power or current provided the various heating elements. The controller can be any suitable component that can communicate with and operate the components of the chamber. The controller may include various circuits, memory, storage, power supply and processor and may have executable control software included on readable media.

Embodiments of the disclosure provide methods to improve ALD uniformity by adjusting the set points of a multi-zone heater. Set points can be power or temperature. The film profile of a prior wafer and the set points employed are used as a basis to provide new set points to improve uniformity. The new set points are based on film response to perturbations from each set point. The responses can be obtained using numerical models of the ALD chamber for a variety of conditions so that the changes in the zone responses for various conditions can be taken into account.

A sensitivity matrix can be formed to characterize the effect of film thickness uniformity as a function of perturbations in heater zone power/temperature settings. The sensitivity matrix can then be applied to experimental results to improve uniformity. The process of depositing a film, measuring the uniformity and adjusting the heater set points can be repeated as necessary to reduce the non-uniformity of the deposited film.

A temperature controller 330 can be connected to the heater assembly 300 to control the power or temperature settings of the individual heater zones. The temperature controller 330 can be part of a control module that operates the processing chamber or a separate controller that works in conjunction with a control module that operates the chamber. Embodiments of the uniformity-improving method can be executed with the temperature controller 330 connected to at least one power supply (not shown).

The temperature controller 330 of some embodiments simplifies and substantially automates the determination of the parameters (power or temperature) associated with each of the individually controllable heating element zones. In particular, the temperature controller 330 determines a plurality of sensitivity values, either experimentally or through numerical simulation, and subsequently uses the sensitivity values to adjust the parameters associated with each of the individually controllable heating elements. The sensitivity values may be placed in a table or may be in the form of a sensitivities matrix. The table/matrix holds information corresponding to process parameter changes (e.g., thickness of the deposited film) at various points on the substrate due to perturbations (e.g., temperature or power) to each of the individually controllable heating elements. The table/matrix can be derived from data from a baseline substrate plus data from separate processes with perturbation of a controllable parameter to each of the individually controllable heating elements.

Figure 7:
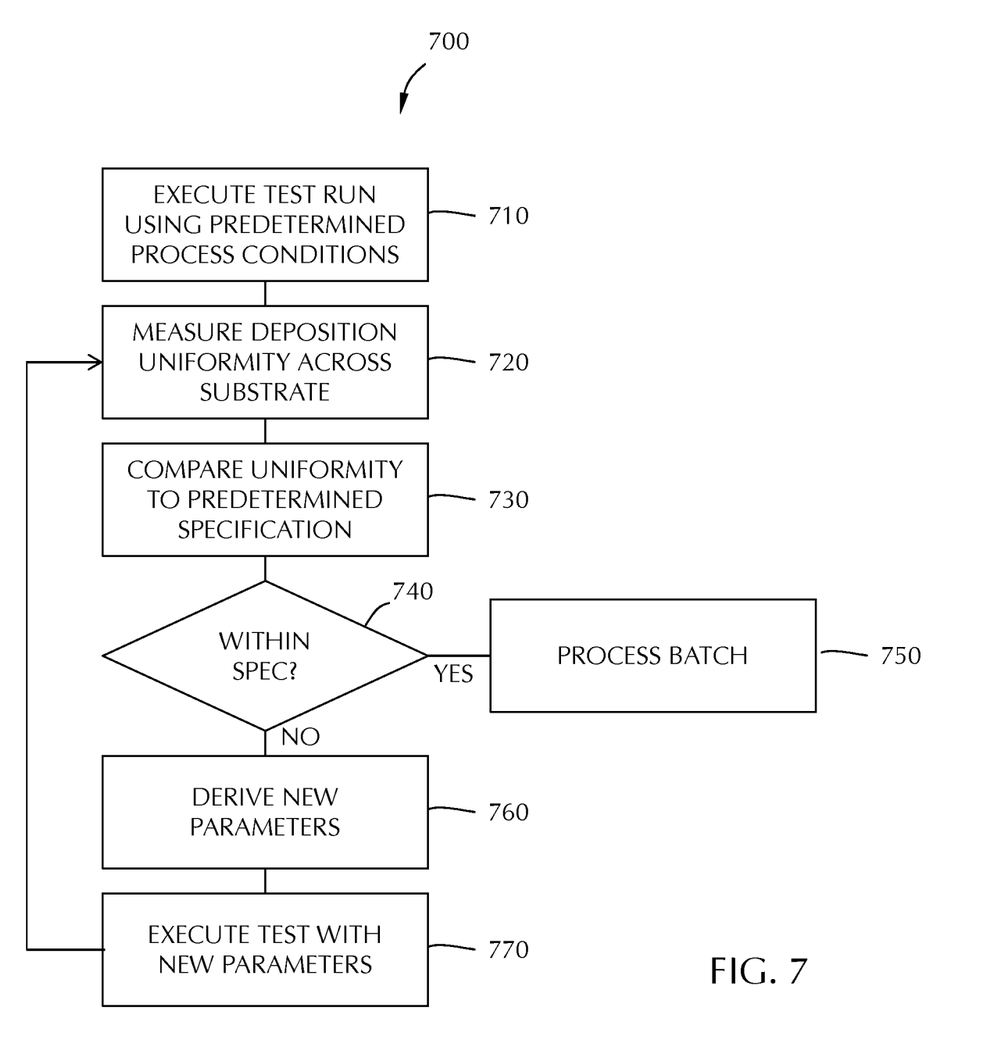
FIG. 7 shows a flowchart of a processing method in accordance with one or more embodiment of the disclosure.

Once the values for the sensitivity table/matrix have been determined, the values may be stored in and used by temperature controller 330 to control one or more of the parameters used in connection with each of the individually controllable heating elements. FIG. 7 is a flow diagram illustrating an exemplary embodiment in which the sensitivity table/matrix may be used to calculate parameters for each of the individually controllable heating zones that may be used to improve process uniformity.

At phase 710 of method 700, a substrate is processed using predetermined processing conditions. The predetermined processing conditions include temperature of power set points for the individual heating elements in the heating zones.

After the test run is complete, the uniformity of the deposited film is measured at phase 720. The uniformity of the deposited film can be measured at any suitable locations on the substrate. In some embodiments, the uniformity is measured at a number in the range of about 11 to about 99, or in the range about 23 to about 87, or in the range of about 35 to about 75, or in the range of about 43 to about 61, or in the range of about 45 to about 55 points on the substrate surface. The points on the surface used for measurement remain substantially the same from substrate to substrate so that the effect of perturbations on the heating parameters is not skewed by measurement location differences.

At phase 730, the uniformity of the deposited film is compared against a predetermined specification. As used in this manner, a "specification" is a limit on the deposition uniformity that is considered acceptable for the process. At phase 740, the decision to adjust parameters of proceed to batch processing is considered. If the deposition uniformity is within specification, the method 700 can proceed to phase 750 in which a batch of substrates are processed using the determined parameters. If the uniformity is within specification on the first attempt, the parameters are those of the predetermined process. If the uniformity is not within specification, or if the operator wishes to improve uniformity, new parameters for the heating zones are derived at phase 760.

At phase 760, the temperature controller 330 derives a new heater zone set point based on calculations including the values of the sensitivity table/matrix. Once the new heater zone set points are derived, the temperature controller 330 uses the new set points to execute another test deposition, at phase 770. After deposition of the test workpiece using the new heater zone set points, the method 700 repeats phases 720, 730, 740 to determine if the deposition uniformity is within specification. If the deposition uniformity is not within specification, a further set of heater zone set points can be derived at phase 760 and another test substrate can be processed at phase 770. The cycle of controlling set points of the heater zones, depositing a film and analyzing the film uniformity can be repeated any number of times to bring the deposition uniformity to pass a predetermined criterion.

The heater zone set points may be provided to the temperature controller 330 by a user interface and/or a metrics tool. The user interface can include a keyboard, a touch-sensitive screen, a voice recognition system, and/or other input devices. The metrics tool may be an automated tool that is used to measure the physical characteristics of the test workpiece after the test run, such as a metrology station. When both a user interface and a metrics tool are employed, the user interface may be used to input the predetermined physical characteristics (i.e., film uniformity specification) that are to be achieved by the process while metrics tool may be used to directly communicate the measured physical characteristics of the test workpiece to the temperature controller 330. In the absence of a metrics tool that can communicate with temperature controller 330, the measured physical characteristics of the test workpiece can be provided to temperature controller 330 through the user interface, or by removable data storage media, such as a floppy disk. It will be recognized that the foregoing are only examples of suitable data communications devices and that other data communications devices may be used to provide the first and second set of input parameters to temperature controller.

In some embodiments, a sensitivity matrix is first derived from experimental or numerically simulated data. The sensitivity matrix can include data indicative of the changes in film uniformity as a function of the temperature or power for each of the heating zones. A film is deposited on a baseline workpiece following a predetermined recipe with predetermined set points for the heater zones. The thickness uniformity of the resulting film is then measured as a function of the position on the workpiece. These data points can then be used as baseline measurements that are compared to the data acquired as the power or temperature of each of the individual heating zones is changed.

In order to predict change in the thickness uniformity as a function of a change in power or temperature set points, a sensitivity matrix is generated numerically using the baseline film thickness profile and as many perturbation curves as heating zones. The thickness of a sample film can be measured at a plurality of regions on the substrate to develop a thickness uniformity map. The controller can then use the plurality of measurements to determine what set point changes will predict an improvement in the uniformity. In some embodiments, the controller is configured to hold one or more heating zone power or temperature setting at a fixed value. For example, in the four zone system illustrated in FIG. 6, the controller may be configured to hold the third zone 313 at a fixed temperature or power set point. The controller may then determine the effect of changes to the first zone 311, second zone 312 and fourth zone 314 on the uniformity.

In some embodiments, there is a heat shield 340 positioned between two of the heating zones. The heat shield 340 can be used to dampen the temperature effects of adjacent heating zones to prevent overheating or to decrease the temperature non-uniformity of the heating zones. The heat shield 340 of some embodiments is positioned between the first heating zone 311 and the second heating zone 312. In some embodiments, as shown in FIG. 6, the heat shield 340 is positioned between the third heating zone 313 and the fourth heating zone 314.

The heat shield 340 can be made of any suitable material. In some embodiments, the heat shield 340 comprises quartz. In some embodiments, the heat shield 340 comprises stainless steel.

The heat shield 340 can be operatively connected to an actuator 342 configured to move the heat shield 340. The actuator 342 might move the heat shield closer to or further from the susceptor assembly 140 and/or to move the heat shield to change the relative distances between the adjacent heating zones. The actuator 342 can be operatively connected to the temperature controller 330. The effects of the heat shield 340 position on the process uniformity can be included in the sensitivity matrix and the position of the heat shield 340 can be adjusted by applying the sensitivity matrix.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
   a gas distribution assembly;
   a susceptor assembly having a central support post and a top surface adjacent to and spaced from the gas distribution assembly;
   a heater assembly comprising a plurality of heating elements arranged in heating zones, each heating zone spaced a distance from the central support post so that each heating zone is a different distance from the support post, and a heat shield positioned between two of the heating zones; and
   a controller operatively connected to the plurality of heating elements, the controller configured to adjust power or temperature of one or more of the heating elements based on a plurality of film thickness measurement and a sensitivity matrix characterizing effects of changes in temperature or power set points for the individual heating zones.

2. The processing chamber of claim 1, wherein the heater assembly comprises four heating elements spaced at increasing distances from the central support post, the four heating elements forming a first heating zone, a second heating zone, a third heating zone and a fourth heating zone.

3. The processing chamber of claim 2, wherein the controller is configured to hold one of the heating zones at a fixed temperature or power set point and determine adjustment values for the other three heating zones.

4. The processing chamber of claim 3, wherein the heating zone held at the fixed temperature or power set point is the second zone.

5. The processing chamber of claim 3, wherein the heating zone held at the fixed temperature or power set point is the third zone.

6. The processing chamber of claim 2, wherein the heat shield is positioned between the first heating zone and the second heating zone.

7. The processing chamber of claim 2, wherein the heat shield is positioned between the third heating zone and the fourth heating zone.

8. The processing chamber of claim 1, wherein the heat shield is quartz.

9. The processing chamber of claim 1, wherein the heat shield is stainless steel.

10. The processing chamber of claim 1, wherein the controller is configured to move the heat shield.

11. The processing chamber of claim 1, wherein each of the heating elements comprise graphite.

12. A processing chamber comprising:
    a gas distribution assembly;
    a susceptor assembly having a central support post and a top surface adjacent to and spaced from the gas distribution assembly;
    a heater assembly comprising four heating elements spaced at increasing distances from the central support post, the four heating elements forming a first heating zone, a second heating zone, a third heating zone and a fourth heating zone, the heater assembly including a heat shield positioned between one or more of the first heating zone and the second heating zone or the third heating zone and the fourth heating zone, the heat shield comprising one or more of quartz or stainless steel; and
    a controller operatively connected to the plurality of heating elements, the controller configured to adjust power or temperature of one or more of the heating elements based on a plurality of film thickness measurement and a sensitivity matrix characterizing effects of changes in temperature or power set points for the individual heating zones.

13. A method of forming a film, the method comprising:
    depositing a film on a substrate using a predetermined processing method, the processing method including temperature or power set points for a plurality of heating zones;
    measuring a thickness of the film at a plurality of locations on the substrate and converting the plurality of thickness measurements to temperature;
    adjusting the temperature or power set points of at least one of the heating zones based on the plurality of thickness measurements, wherein adjusting the temperature or power set points comprises applying a sensitivity matrix to adjust at least one of the heating zones, the sensitivity matrix characterizing effects of changes in temperature or power set points for individual heating zones on deposited material thickness at the plurality of locations on the substrate;
    depositing a second film on a second substrate using the predetermined method with the adjusted temperature or power set points and measuring a thickness of the second film at the plurality of locations; and
    repeating adjusting the temperature or power set points, depositing a film and measuring the thickness at a plurality of locations on the substrate to lower a thickness non-uniformity of the deposited film.

14. The method of claim 13, wherein depositing the film occurs on a plurality of substrates and the plurality of thickness measurements are average values of the plurality of substrates.

15. The method of claim 13, wherein depositing the second film on the second substrate occurs on a plurality of second substrates and the plurality of thickness measurements are average values of the plurality of substrates.

16. The method of claim 13, wherein applying the sensitivity matrix comprises fixing the temperature or power set points for one of the individual heating zones and determining new set points for the other heating zones.

17. The method of claim 16, wherein there are four heating zones arranged at increasing distances from a central support post about which the substrates are rotated during processing.

18. The method of claim 17, wherein the fixed heating zone is the second heating zone or the third heating zone.

19. The method of claim 13, further comprising positioning a shield between one or more of the first heating zone and the second heating zone or the third heating zone and the fourth heating zone.

* * * * *